United States Patent [19]

Sakamoto

[11] Patent Number: 5,663,094

[45] Date of Patent: Sep. 2, 1997

[54] PROCESS FOR PRODUCING SEMICONDUCTOR DEVICE WITH WIRE FOR THREE CONDUCTIVE LAYERS

[75] Inventor: Masaru Sakamoto, Atsugi, Japan

[73] Assignee: Canon Kabushiki Kaisha, Tokyo, Japan

[21] Appl. No.: 351,957

[22] Filed: Dec. 8, 1994

[30] Foreign Application Priority Data

Dec. 10, 1993 [JP] Japan .................. 5-310188
Dec. 6, 1994 [JP] Japan .................. 6-301847

[51] Int. Cl.⁶ .................. H01L 21/443; H01L 23/552; H01L 31/0224
[52] U.S. Cl. .................. 438/609; 438/586; 438/637
[58] Field of Search .................. 437/21, 40 TFI, 437/40 TFT, 41 TFI, 41 TFT, 181, 195

[56] References Cited

U.S. PATENT DOCUMENTS

| 4,735,908 | 4/1988 | Higashi et al. .................. 437/181 |
| 5,061,979 | 10/1991 | Kobayashi et al. . |
| 5,242,858 | 9/1993 | Sakamoto et al. .................. 437/162 |
| 5,294,836 | 3/1994 | Kishi . |
| 5,304,775 | 4/1994 | Fujiwara et al. .................. 219/121.43 |
| 5,395,650 | 3/1995 | Holl et al. .................. 427/250 |
| 5,529,956 | 6/1996 | Morishita .................. 437/193 |

FOREIGN PATENT DOCUMENTS

| 0460857 | 12/1991 | European Pat. Off. . |
| 0 461 908 | 12/1991 | European Pat. Off. .................. 437/181 |
| 0558007 | 9/1993 | European Pat. Off. . |
| 0558055 | 9/1993 | European Pat. Off. . |
| 53-25384 | 3/1978 | Japan .................. 437/181 |
| 58-219768 | 12/1983 | Japan .................. 437/181 |
| 5-152448 | 6/1993 | Japan . |

*Primary Examiner*—Mary Wilczewski
*Attorney, Agent, or Firm*—Fitzpatrick, Cella, Harper & Scinto

[57] ABSTRACT

A semiconductor device having i) a common opening 110 reaching a conductive region 105 through at least one conductive layer 107 and ii) another conductive layer 109 deposited in the opening 101, the conductive layer 107 and the conductive region 105 being electrically connected in the common opening 110. Also disclosed is a process comprising previously forming a plurality of conductive regions 105 and 107, thereafter forming an opening 110 that opens at the conductive regions, and depositing another conductive region 109 in the opening 110 to electrically connect the respective conductive regions in the opening. This can achieve a wiring connection structure that enables prevention of an increase in the number of masks used to form openings for wiring connection, an increase in the number of steps and an increase in the area held by openings, to thereby enhance the degree of integration of semiconductor devices.

5 Claims, 7 Drawing Sheets

PROCESS FOR PRODUCING SEMICONDUCTOR DEVICE WITH WIRE FOR THREE CONDUCTIVE LAYERS

BACKGROUND OF THE INVENTION

1. Field of the Invention

This invention relates to a semiconductor device and a process for producing the same. More particularly, it relates to a method for interconnecting wirings of a semiconductor integrated circuit.

2. Related Background Art

In recent years, the degree of integration of semiconductor devices has been made higher year after year with a miniaturization of the devices. Since, however, the number of wirings required increases with an increase in the degree of integration, it is not too much to say under existing circumstances that the degree of integration depends on the structure of wiring.

In addition, because of an increase in load on wirings, multi-layer wiring of three- to four-layer configuration is used at present. However, what comes into question because of the multi-layer wiring is techniques for interconnecting wirings.

In order to interconnect wirings, openings must be provided in insulating films for each layer, and hence it has been hitherto necessary in the case of, e.g., four-layer wiring, to carry out patterning end etching for providing openings simply at least four times.

Figure 6A:
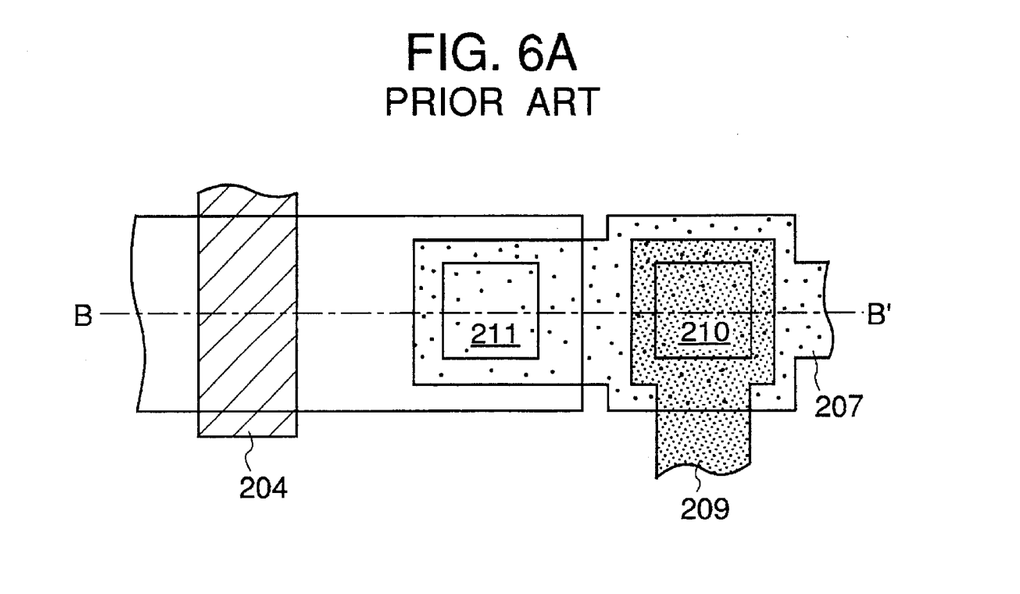
FIGS. 6A and 6B illustrate an electrode structure of a conventional semiconductor device.
Figure 6B:
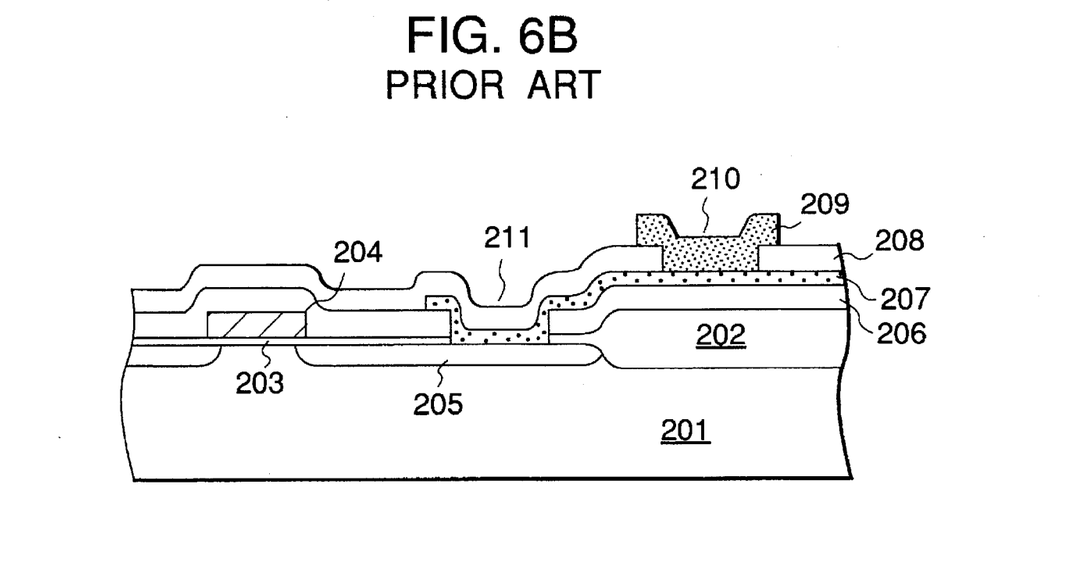

FIGS. 6A and 6B are schematic representation of the structure of an MOS transistor to illustrate the wiring structure of conventional multi-layer wiring, in which FIG. 6A is a top view thereof and FIG. 6B a cross-sectional view taken along the line B—B' in FIG. 6A.

In FIGS. 6A and 6B, reference numeral 201 denotes a semiconductor substrate (with a conductivity type reverse to that of a first conductivity type); 202, a device separating region (LOCOS); 203, a gate oxide film; 204, a gate electrode; 205, a drain region (a first conductivity type region); 206, an insulating film; 205, a second conductivity type wiring; 208, an interlayer insulating film; 209, a third conductivity type wiring; 210, an opening made secondly; and 211, an opening made firstly.

In the device shown in FIGS. 6A and 6B, the opening 211 is made toward the drain region 205 (a first conductivity type region) for its connection to the second conductivity type wiring 205, and then the opening 210 is made so as to connect the wiring 205 to the third conductivity type wiring 209. In setting up such connection, the operations in twice to make openings enable conduction of the potential of the drain 205 to the upper layer wiring 209.

Here, the area of the opening can be made smaller and after all the degree of integration of a semiconductor device can be increased if the second-time opening 210 can be provided on the first-time opening 211.

Figure 7A:
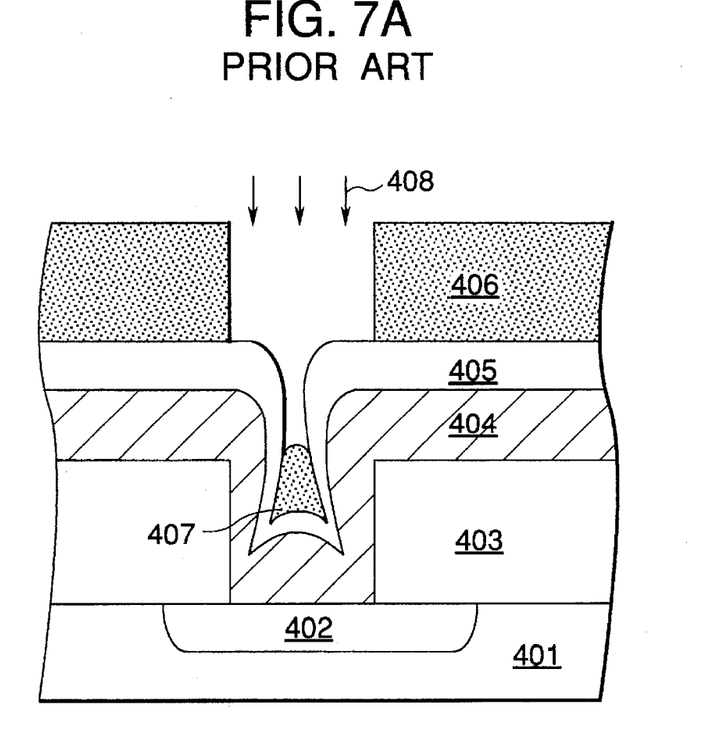
FIGS. 7A and 7B illustrate the conventional steps of making up the structure wherein three-layer conductive wirings are connected at one opening.
Figure 7B:
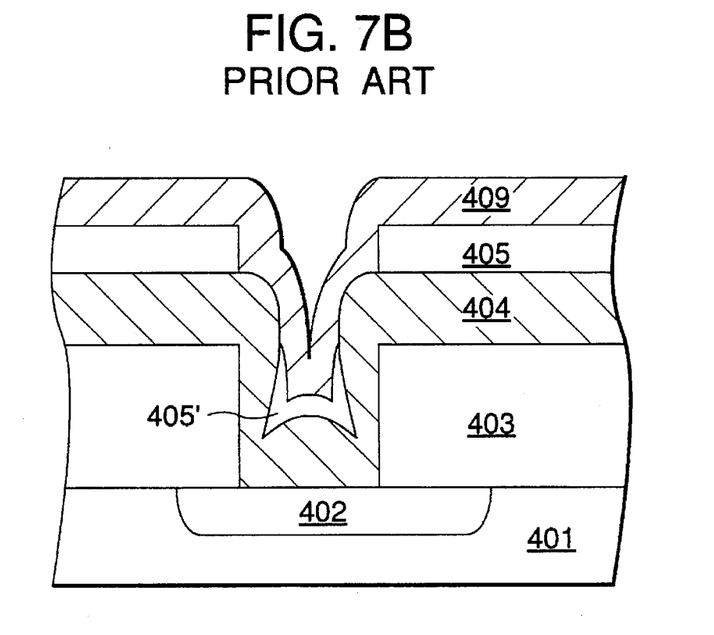

For such purpose, research has been done to provide the second-time opening on the first-time opening. FIGS. 7A and 7B illustrate an example of the steps of overlapping such openings. In FIGS. 7A and 7B, reference numeral 401 denotes a semiconductor substrate; 402, a drain region serving also as a first conductivity type wiring; 403, an insulating film; 404, a second conductivity type wiring; 405, an interlayer insulating film; 406, a resist layer; 407, a resist residue; 408, an etching gas; and 409, a third conductivity type wiring. In this example, the second and the third conductivity type wirings 404 and 409 are connected to the drain region 402 at the same opening. In FIGS. 7A and 7B, FIG. 7A is a schematic cross-sectional view of the step of etching to make the second-time opening, and FIG. 7B is a schematic cross-sectional view when the third conductivity type wiring is provided after the etching. In these steps, the insulating film 403 is first etched to make an opening. Next, the second conductivity type wiring 404 is provided, then the interlayer insulating film 405 is provided thereon, and the resist layer 406 is further provided thereon. Now, the resist layer 406 is patterned and the interlayer insulating film 405 is selectively etched by the etching gas 408 (FIG. 7A). Then the third conductivity type wiring 409 is provided (FIG. 7B).

Here, as shown in FIGS. 7A and 7B, since the resist residue 407 remains in the opening, a part of an interlayer insulating film 405' remains unetched, even if the selective etching is carried out when the second-time opening is formed. Hence, the second conductivity type wiring and the third conductivity type wiring can not be well connected thereby causing problems of an increase in contact resistance and a lowering of reliability.

Since also the two layers of the insulating film 403 and the interlayer insulating film 405 are separately etched, the step of masking must be taken twice. Thus, there is another problem that the same cost as in the connection as shown in FIGS. 7A and 7B is required.

SUMMARY OF THE INVENTION

An object of the present invention is to achieve a wiring connecting structure that can decrease the steps of masking and make smaller the area held by openings so that the degree of integration of semiconductor devices can be enhanced.

To solve the problems, the present inventors have accomplished the invention described below. The semiconductor device of the present invention is a semiconductor device comprising a first conductive layer and a second conductive layer which are superposed via an insulating layer, the first and second conductive layers being electrically connected, wherein the first and second conductive layers are electrically connected by providing a conductive member in an opening formed by removing part of the second conductive layer and part of the insulating layer.

The present invention also includes a process for producing a semiconductor device. The process of the present invention is a process for producing a semiconductor device comprising a first conductive layer and a second conductive layer which are superposed via an insulating layer, the first and second conductive layers being electrically connected, which includes the steps of:

a) simultaneously removing part of the second conductive layer and part of the insulating layer to expose the first conductive layer; and b) depositing a conductive member on the part at which the stated layers are removed, to electrically connect the first conductive layer and the second conductive layer.

In the semiconductor device of the present invention, the insulating layer existing between the first conductive layer and the second conductive layer may be further provided therein with an additional conductive layer, the additional conductive layer being electrically connected to the conductive member. This additional conductive layer may also be present in plurality.

DETAILED DESCRIPTION OF THE PREFERRED EMBODIMENTS

According to the process of the present invention, it is unnecessary to repeat the steps of making an opening every time each wiring layer is formed and depositing a conductive layer in the opening, and three or more regions can be connected by one-time operation to make an opening, carried out after multi-layer conductive regions have been formed. Hence, the degree of integration can be enhanced without causing an increase in contact resistance and so forth which are due to faulty etching, even when the openings are unified as is conventionally done. In the semiconductor device of the present invention, the conductive layers can be firmly connected to one another, and hence the semiconductor device of the present invention can stably operate over a long period of time.

The technique that has made it possible to accomplish the present invention is in the first place a film-forming technique contributing good coverage properties and an anisotropic etching technique promising a high aspect ratio (opening depth/opening width).

For example, in the case of an aspect ratio (opening depth/opening width) of up to about 1 where the area of the opening is 1 μm square and the opening depth is 1 μm, the present invention can be applied using a sputtering apparatus to form a deposited film and using an RIE (reactive ion etching) apparatus to carry out etching. On the other hand, in the case of an aspect ratio of more than 1, a selective CVD apparatus and an ECR type etching apparatus must be used to form a deposited film and to carry out etching, respectively.

When Al is deposited as the conductive member, a selective CVD apparatus may preferably be used to carry out Al-CVD. The Al-CVD is a process in which an alkylaluminum hydride gas and hydrogen gas are used to form a deposited film on an electron-donative substrate by a surface reaction.

This process is a process suited for burying a metal material in a fine and deep opening (contact hole or throughhole) having an aspect ratio of, e.g., 1 or more, and also a deposition process having an excellent selectivity. Metal films formed by this process have a very good crystallinity so that a monocrystalline Al film can be formed, and contains little carbon or the like.

Similarly, thus deposited Al film has so good a crystallinity as to have a small resistivity of from 0.7 to 3.4 μΩ·cm and have a high reflectance of from 85 to 95%. It can also have such good surface properties as to have a 1 μm or larger hillock density (surface unevenness ascribable to recrystallization of Al) of 1 to 100 cm$^{-2}$. Also, the probability of occurrence of alloy spikes at the interface with silicon (a phenomenon in which Al permeates into the region of silicon) becomes substantially equal to 0 (zero) when the probability of break of a 0.15 μm semiconductor junction is taken.

Al films with a good quality can be deposited especially when an alkylaluminum hydride containing a methyl group as exemplified by monomethylaluminum hydride (MMAH) or dimethylaluminum hydride (DMAH) is used as a starting material gas, $H_2$ gas is used as a reactive gas and the substrate surface is heated in an atmosphere of a mixture of these gases.

Here, in selective deposition of Al, the surface temperature of the substrate may preferably be kept not lower than the decomposition temperature of the alkylaluminum hydride and lower than 450° C., more preferably not lower than 260° C. and not higher than 440° C., and most preferably not lower than 260° C. and not higher than 350° C., by direct heating or indirect heating.

The substrate can be heated at temperatures of the above range by a method including direct heating and indirect heating. Especially when the substrate is kept at the above temperatures by direct heating, Al films with a good quality can be formed at a high deposition rate. For example, when the substrate surface temperature in the formation of Al films is controlled within the more preferred temperature range of from 260° C. to 440° C., films with a good quality can be obtained at a deposition rate of as much as 3,000 to 5,000 angstrom per minute, which is higher than the case of resistance heating. Such direct heating (the energy from a heating means is directly conducted to the substrate to heat the substrate itself) can be made by lamp heating using, e.g., a halogen lamp or a xenon lamp.

The indirect heating includes resistance heating. For example, it can be carried out using a heating element provided on a substrate holding member provided in a deposited film forming space in order to hold the substrate on which a deposited film is to be formed.

By the Al-CVD process, when a CVD process is applied to a substrate having both an electron-donative surface portion and an electron-non-donative surface portion, a single-crystal of Al can be formed in a good selectivity only at the electron-donative surface portion of the substrate.

Electron-donative materials refer to materials in which free electrons are naturally or originally present in the substrate or free electrons are intentionally produced therein, and those having a surface on which chemical reaction is accelerated upon transfer of electrons between the substrate and starting gas molecules adhering to its surface. For example, in general, metals and semiconductors come under such materials. Metals of semiconductors on the surfaces of which a thin oxide film is present are also capable of causing chemical reaction upon transfer of electrons between the substrate and the starting gas molecules adhering these to, and hence are included in the electron-donative materials of the present invention.

The electron-donative materials can be specifically exemplified by binary, ternary or more multi-element III–V compound semiconductors comprised of combination of any of Ga, In and Al as Group III elements and P, As and N as Group V elements, or semiconductor materials such as monocrystalline silicon and amorphous silicon; as well as metals, alloys and silicides such as tungsten, molybdenum, tantalum, copper, titanium, aluminum, titanium aluminum, titanium nitride, aluminum silicon copper, aluminum palladium, tungsten silicide, titanium silicide, aluminum silicide, molybdenum silicide, tantalum silicide and the like.

On the other hand, materials that form surfaces on which Al or Al—Si is not selectively deposited, i.e., the electron-non-donative materials may include silicon oxides formed by thermal oxidation, CVD or the like, glasses such as BSG, PSG and BPSG, or oxide films, thermally formed nitride films, and silicon nitride films formed by plasma CVD, low pressure CVD, ECR-CVD or the like.

This Al-CVD enables selective deposition of even metal films mainly composed of Al as shown below, and their film quality can be high enough to show excellent characteristics.

For example, in addition to the alkylaluminum hydride gases and hydrogen, Si atom-containing gases such as $SiH_4$, $Si_2H_6$, $Si_3H_8$, $Si(CH_3)_4$, $SiCl_4$, $SiH_2Cl_2$ and $SiHCl_3$, Ti atom-containing gases such as $TiCl_4$, $TiBr_4$ and $Ti(CH_3)_4$, Cu atom-containing gases such as bis(acetylacetonate) copper $Cu(C_5H_7O_2)_2$, bis(dipivaloylmetanito)copper $Cu(C_{11}H_{19}O_2)_2$ and bis(hexafluoroacetylacetonato)copper $Cu(C_5HF_6O_2)_2$ may be introduced in appropriate combination to form a mixed gas atmosphere so that conductive materials such as Al—Si, Al—Ti, Al—Cu, Al—Si—Ti and Al—Si—Cu can be selectively deposited to form electrodes.

The above Al-CVD is also a film forming process having a good selectivity, and the films deposited have good surface properties. Hence, a preferable metal film with high general-purpose properties for wiring of semiconductor devices can be obtained in the subsequent deposition step by further forming an Al film or a metal film mainly composed of Al on the Al film selectively deposited and on an insulating layer $SiO_2$ film or the like under application of a non-selective film forming process.

Such a metal film specifically includes the following: Combinations of any of selectively deposited Al, Al—Si, Al—Ti, Al—Cu, Al—Si—Ti and Al—Si—Cu and non-selectively deposited Al, Al—Si, Al—Ti, Al—Cu, Al—Si—Ti and Al—Si—Cu.

A selective CVD apparatus, in particular, an Al-CVD apparatus will be described below with reference to FIG. 3.

Figure 3:
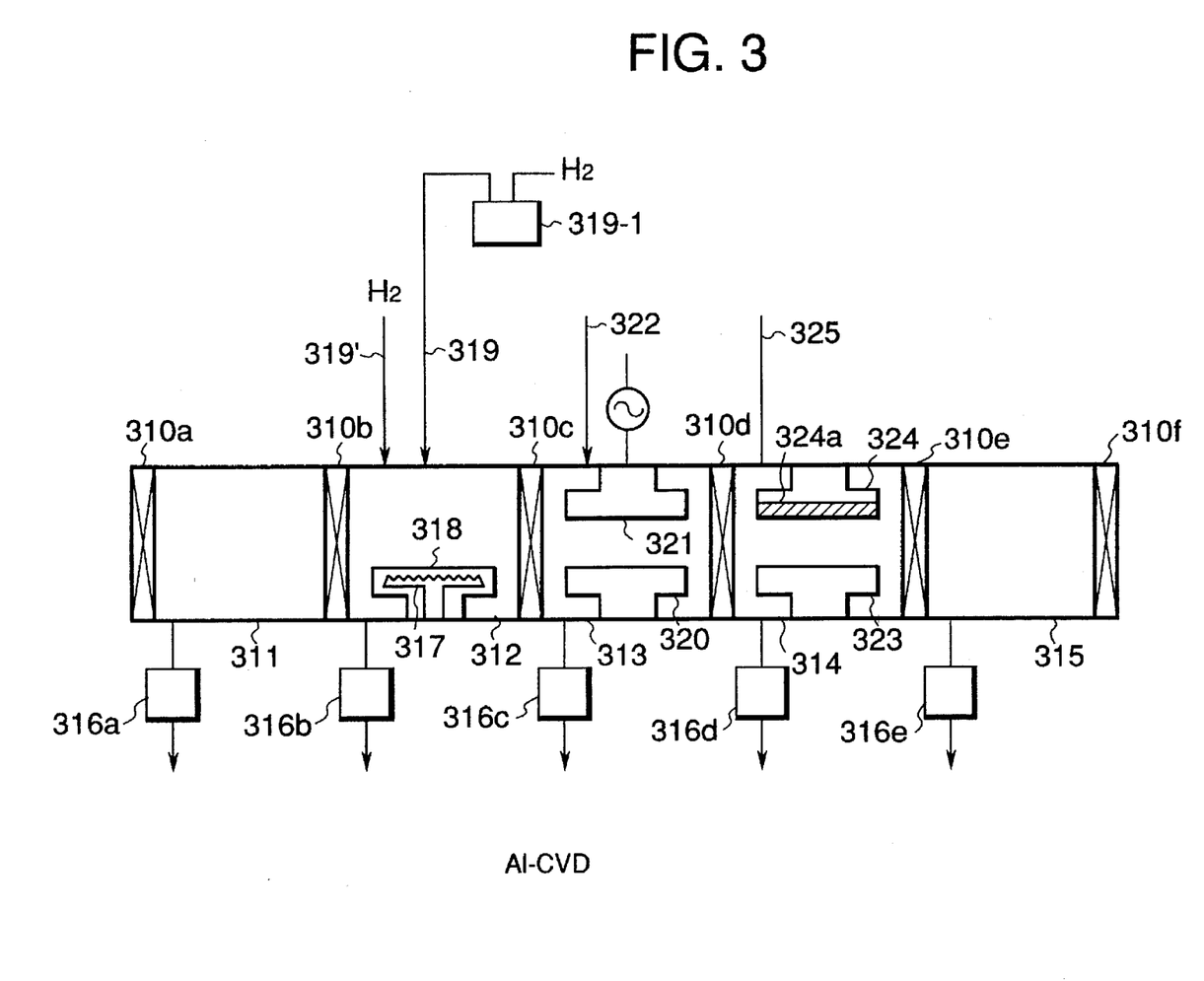
FIG. 3 illustrates the constitution of an Al-CVD apparatus.

As shown in FIG. 3, the apparatus is comprised of load block chamber 311, a CVD reaction chamber 312 as a first film forming chamber, an Rf etching chamber 313, a sputtering chamber 314 as a second film forming chamber and a load lock chamber 315 which are successively connected with each other through gate valves 310a to 310f in the state of air shut-off and capable of communicating with each other. These chambers are so constructed that they can be evacuated through exhaust systems 316a to 316e, respectively.

Here, the load lock chamber 311 is a chamber where the substrate atmosphere before deposition is evacuated and replaced with an $H_2$ atmosphere so that the through-put capacity can be improved.

The next CVD reaction chamber 312 is a chamber where a film is selectively deposited on the substrate by the above Al-CVD under normal pressure or low pressure, which is so constructed that a substrate holder 318 having a heating resistor 317 that can heat the substrate surface for film formation to a temperature ranging from at least 200° C. to 450° C. is provided inside the chamber and also a starting material gas such as alkylaluminum hydride having been gasified by bubbling with hydrogen by means of a bubbler 319-1 can be fed into the chamber and hydrogen gas as a reaction gas can be also fed through a gas line 319'.

The subsequent Rf etching chamber 313 is a chamber where the substrate surface having been subjected to selective deposition is cleaned (i.e., etched) in an atmosphere of Ar. In its inside, a substrate holder 320 that can heat the substrate to a temperature ranging from at least 100° C. to 250° C. and an Rf etching electrode line 321 are provided, and also an Ar gas feed line 322 is connected thereto.

The next sputtering chamber 314 is a chamber where a metal film is non-selectively deposited on the substrate surface by sputtering in an atmosphere of Ar. In its inside, a substrate holder 323 that can heat the substrate to a temperature ranging from at least 200° C. to 250° C. and a target electrode 324 to which a sputter target material 324a is fitted are provided, and also an Ar gas feed line 325 is connected thereto.

The load lock chamber 315 finally provided is a chamber where its inside atmosphere is adjusted before the substrate on which a metal film has been deposited is taken out to the open air, and is so constructed that the atmosphere can be replaced by $N_2$.

The film forming process for non-selective deposition may include CVD processes other than the Al-CVD described above, and sputtering.

A conductive film may also be formed by CVD or sputtering, followed by patterning to form a subbing layer having a desired wiring shape, and thereafter an Al film or a metal film mainly composed of Al may be selectively deposited on the subbing layer by Al-CVD to form wiring.

An Al film or a metal film mainly composed of Al may also be formed on an insulating film by using Al-CVD. For that purpose, the insulating film is subjected to surface modification treatment to form a substantially electron-donative surface portion. Such surface modification treatment includes application of plasma damages to an insulating film or irradiation with energy beam such as electrons and ions. In this step, a pattern may be drawn in a desired wiring form, so that, on account of selective deposition, the deposition takes place only on the electron-donative portions drawn in the desired wiring form and hence the wiring can be formed in self-alignment fashion without patterning.

When a multi-layer structure of Al—Si/TiN, Al—Si/TaN or the like is deposited as the conductive member, sputtering may preferably be used. In this sputtering, the TiN layer or TaN layer may preferably be deposited in a thickness of from 500 to 2,000 angstroms, and more preferably 1,000 angstroms. The Al—Si layer may preferably be deposited in a thickness of from 3,000 to 6,000 angstroms, and more preferably 4,000 angstroms.

In the etching to make an opening, what is required for the ECR type etching apparatus is to carry out the etching anisotropically, regardless of the kind of the material to be etched. Etching rates of some materials when chlorine ($Cl_2$) is used in the ECR type etching apparatus are shown in Table 1 below.

TABLE

| Etching rate in ECR type etching apparatus (Etchant: $Cl_2$; RF power: 40 W; Pressure: 16 mTorr) | |
| --- | --- |
| Materials etched | Etching rate |
| $SiO_2$ | ~2,000 (angstrom/min) |
| PSG | ~2,000 (angstrom/min) |
| Al | ~6,000 (angstrom/min) |
| ITO | ~2,000 (angstrom/min) |
| Si | ~3,000 (angstrom/min) |

Although there are small differences in etching rates, the etching can be carried out anisotropically.

The present invention will be described below in greater detail by giving Examples.

EXAMPLE 1

Figure 1A:
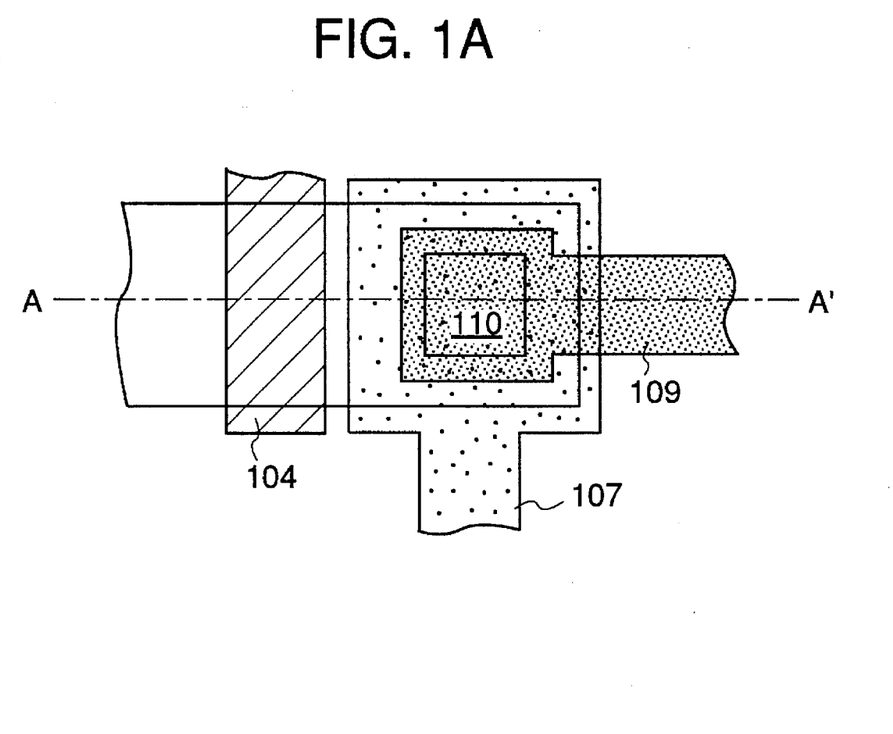
FIGS. 1A and 1B illustrate an electrode structure of the semiconductor device according to the present invention.
Figure 1B:
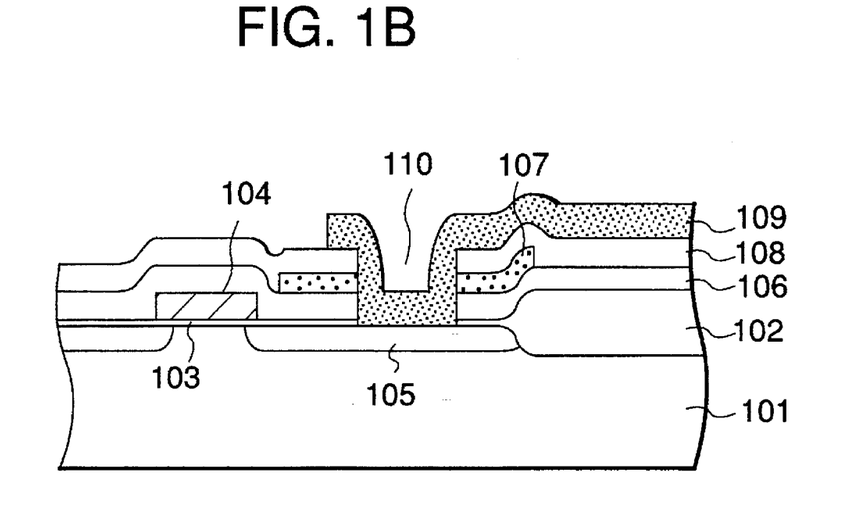

FIGS. 1A and 1B are a plan view (FIG. 1A) and a cross-sectional view taken along the line A-A' (FIG. 1B) therein, of a contact region of a semiconductor device according to Example 1.

In FIGS. 1A and 1B, reference numeral 101 denotes a semiconductor substrate; 102, a field oxide film for separating elements; 103, a gate oxide film; 104, a gate electrode; 105, a first conductive layer as a drain region; 106, an insulating film; 107, a second conductive layer; 108, an insulating film; 109, a conductive member (a third conductive layer); and 110, an opening (a contact hole) for extracting the drain electrode.

The conductive member 109 of the present Example is finely connected with the first conductive layer 105 and the second conductive layer 107 at one opening 110.

Figure 2A:
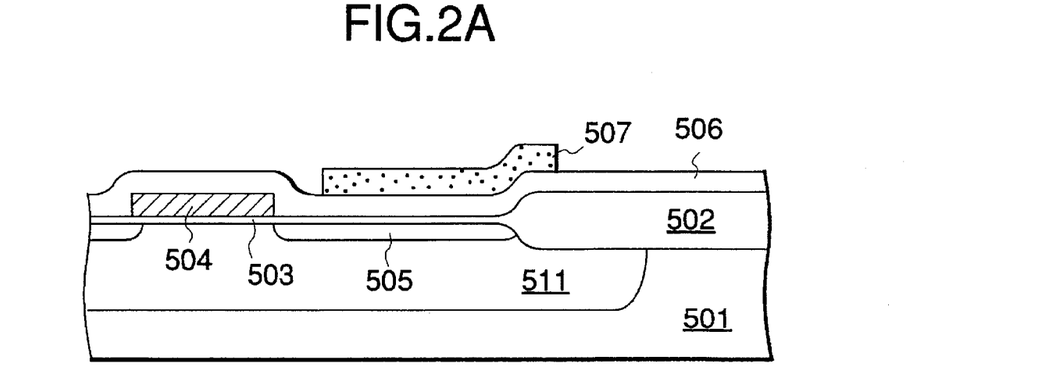
FIGS. 2A to 2C illustrate a process for the production of the semiconductor device according to the present invention.
Figure 2B:
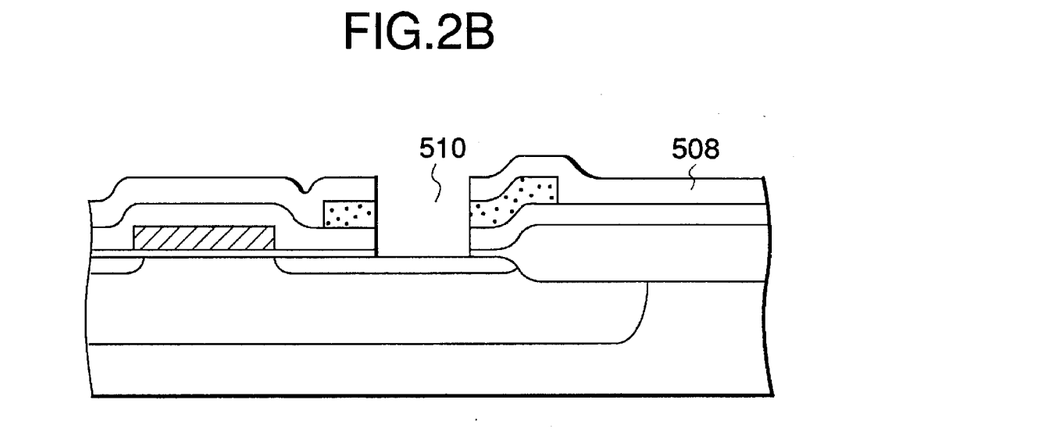
Figure 2C:
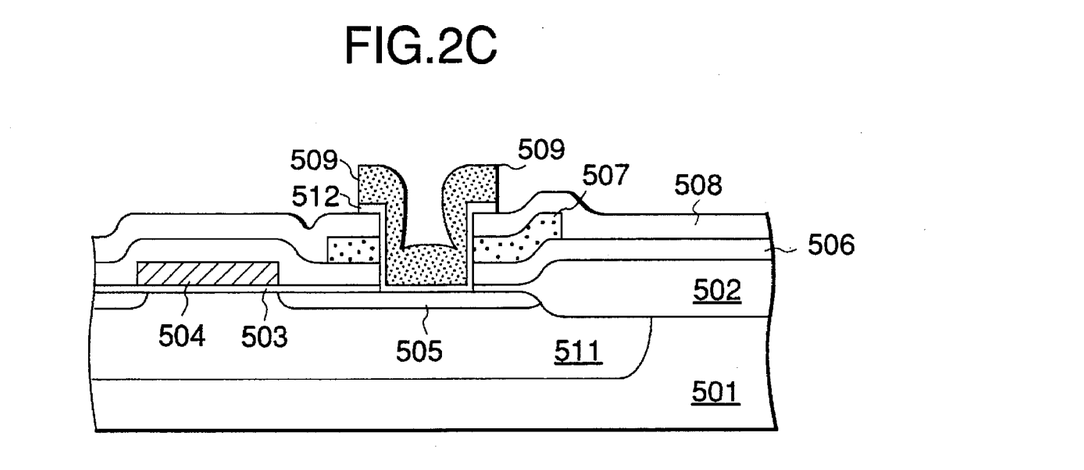

A process for producing the device of the present Example as shown in FIGS. 1A and 1B will be described with reference to FIGS. 2A to 2C cross-sectionally illustrating its steps.

First, on a semiconductor substrate 501, a well region 511 and an element separating region 502 are formed, and thereafter a gate oxide film 503 is formed by thermal oxidation. Next, a polycrystalline silicon film is formed as a gate electrode 504, and then patterned. Subsequently, using this gate electrode 504 as a mask, ion implantation for a source and a drain is carried out, followed by heat treatment.

Next, an insulating film 506 is formed by CVD, and an ITO (indium-tin oxide) film (a transparent electrode) 507 is formed thereon by sputtering, which is then patterned (FIG. 1A).

Subsequently, an insulating film 508 is formed, which is then patterned to form a contact hole (an opening) 510. When this contact hole is formed, etching with chlorine may preferably be carried out up to a drain region 505. When the drain has a shallow junction, $CHF_3$ or the like, having a high selectivity to Si, may be used as an etching gas in the final step, whereby the contact hole 510 can be formed without etching Si (FIG. 2B).

Thereafter, a conductive member 512/509 with a multi-layer structure of, e.g., Al—Si/TiN or Al—Si/TaN is formed by sputtering.

In this sputtering (for, e.g., Al—Si/TiN), reactive sputtering is carried out to deposit TiN (509) in a thickness of 1,000 angstroms in an atmosphere of $N_2$ using Ti as a target. Subsequently, conventional sputtering is carried out to superposingly deposit Al—Si (512) in a thickness of 4,000 angstroms using Al—Si as a target. The Si/TaN double-layer structure can also be formed similarly.

The multi-layer structure is employed in order to prevent Al from breaking the junction of the drain region 505 due to the spike effect of Al—Si and to allow ITO to react with Al to satisfactory maintain the contact resistance between the second conductive layer and the conductive member.

When this structure is produced by a conventional process, in order to maintain the contact resistance between the ITO and the drain, is necessary to add impurities in a dose at least five times the dose required in the present invention. In the present invention, on the other hand, since the drain contact is obtained through Al—Si/TiN or the like, a sufficiently good ohmic contact can be ensured at a dose of about 1E 15 $cm^{-2}$.

It is also clear that the application of the present invention not only brings about a reduction of the number of masks and the number of steps, but also is advantageous in improving the degree of integration. Since also the contact resistance depends on the contact area of the opening, the contact resistance between the second conductive layer and the conductive member is more effectively governed by the thickness of the second conductive layer than the area of the opening. Hence, even when the area of the opening is made finer, the present invention can meet the higher integration by making the thickness of the second conductive layer larger.

In the present Example, the aspect ratio is 1 or less.

EXAMPLE 2

In Example 1, the contact is formed to have the multi-layer structure of Al—Si/TiN, Al—Si/TaN or the like used as a conductive member. Hence, the aspect ratio is 1 or less. In Example 2, Al is deposited using a selective CVD apparatus while using Al-CVD. Hence, a conductive wiring 109 made of Al and having an aspect ratio of 1 or more can be formed. This Al wiring has such good crystallinity as to have a small resistivity of from 0.7 to 3.4 μΩ·cm and to have a high reflectance of from 85 to 95%. It also has such good surface properties as to have a 1 μm or larger hillock density of 1 to 100 $cm^{-2}$. At the interface between Al and silicon, the probability of occurrence of alloy spikes is almost zero in a 0.15 μm semiconductor junction. In this method, different from Example 1, the contact hole 510 can be completely filled with Al.

EXAMPLE 3

In Example 1, the contact is formed through ITO, having the double-layer structure of Al—Si/TiN or Al—Si/TaN. A method of more decreasing the contact resistance thereof will be shown here.

A contact hole is formed in the same manner as in Example 1. Thereafter, a contact is formed by having the triple-layer structure of Al—Si/TiN/Ti, Al—Si/TaN/Ta or the like, whereby it becomes possible to further decrease contact resistance uneveness.

EXAMPLE 4

Figure 4A:
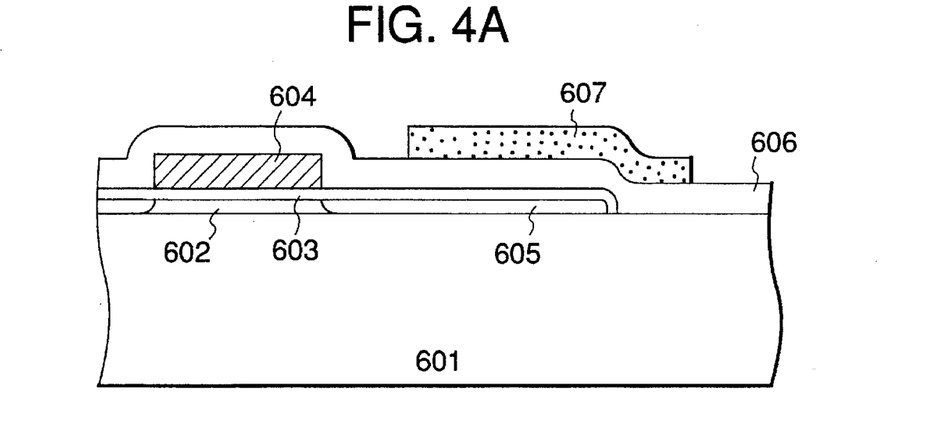
FIGS. 4A to 4C illustrate an example to which the semiconductor device of the present invention is applied.
Figure 4B:
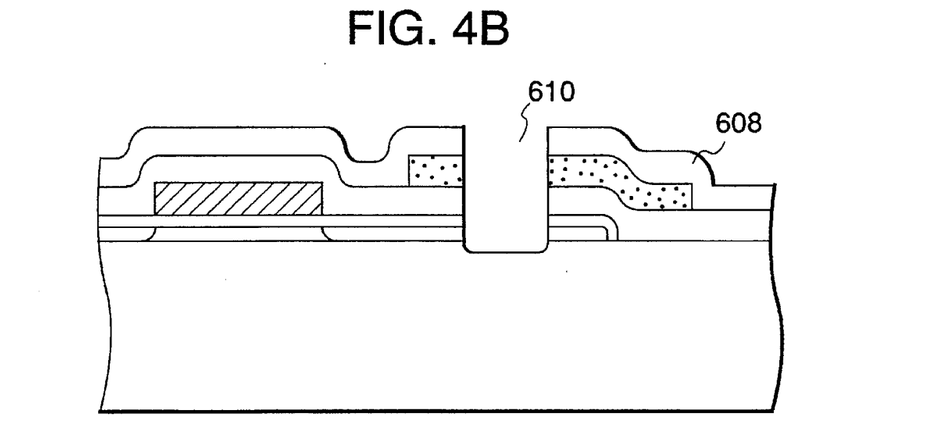
Figure 4C:
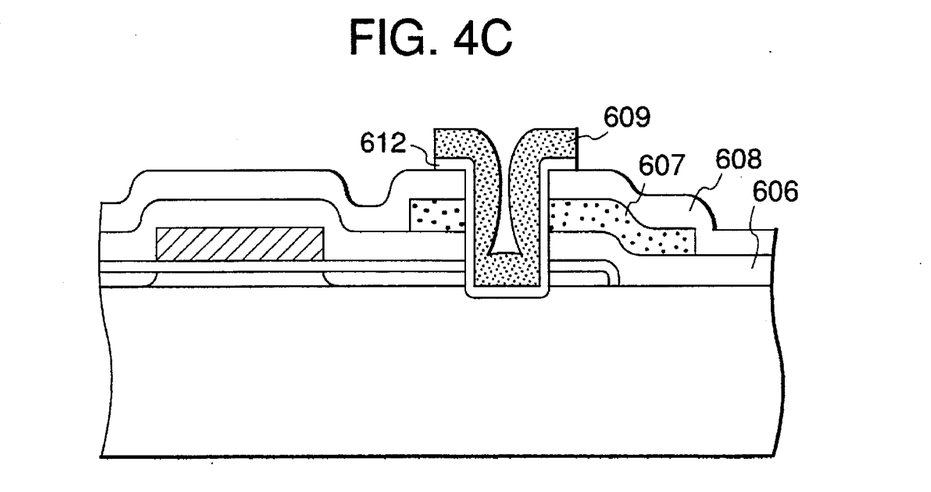

An example in which the present invention is applied to a TFT (thin film transistor) on a glass substrate will be described. FIGS. 4A to 4C cross-sectionally illustrate the present Example. In FIGS. 4A to 4C, reference numeral 601 denotes a glass substrate; 602 and 605, a channel region and a drain region as a first conductive layer of TFT, respectively; 605, a gate insulating film; and 604, a gate electrode. Reference numerals 606 and 608 denote insulating films; 607, a transparent electrode as a second conductive layer; 610, a contact hole; 612, a TiN film; and 609, an Al—Si film. The TiN film 612 and the Al—Si film make up a conductive member.

In the case of TFT, the Si thickness needs to be about 500 angstroms for controlling its OFF current. Hence, when the contact hole is formed, etching may reach the underlying glass substrate. The present invention can achieve a good contact even in such a case.

First, the TFT region 602 is formed on the glass substrate 601, and this region is selectively etched away to form element separation. Thereafter, a gate oxide film 603 is formed by thermal oxidation. A polycrystalline silicon film is then formed as the gate electrode 604, which is then patterned. Subsequently, using this gate electrode 604 as a mask, ion implantation for a source and a drain is carried out, followed by heat treatment.

Next, an insulating film 606 is formed by CVD, and an ITO film (a transparent electrode) 607 is formed thereon by sputtering, which is then patterned (FIG. 4A).

Subsequently, an insulating film 608 is formed, which is then patterned, and a contact hole (an opening) 610 is formed. Since the TFT drain region 605 is formed of a thin film, a through-hole may be formed in some cases (FIG. 4B). Even in such cases, a good contact can be obtained by forming the conductive member 612/609 by sputtering (FIG. 4C).

EXAMPLE 5

The present invention can also be applied to simultaneous etching of insulating films having different etching depths. An example thereof will be described with reference to FIG. 5.

Figure 5:
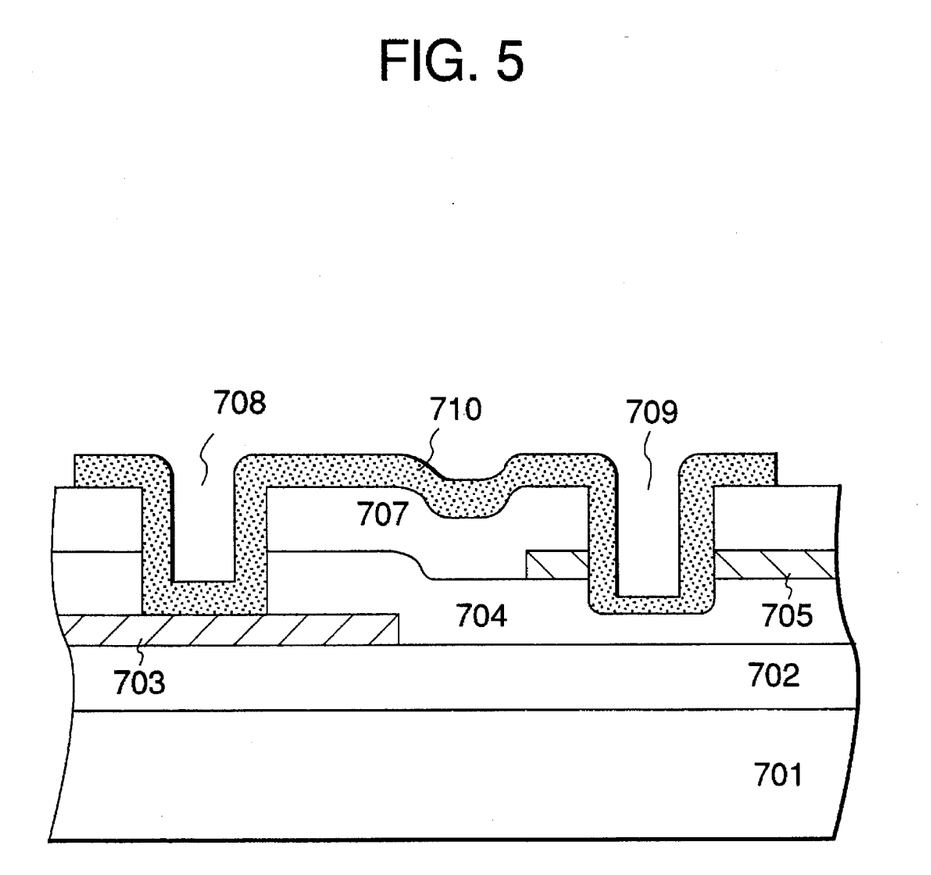
FIG. 5 illustrates another example to which the semiconductor device of the present invention is applied.

In FIG. 5, reference numeral 701 denotes a semiconductor substrate; 702, a thermal oxide film; 703, a first conductive layer; 704, an insulating film; 705, a second conductive layer; 707, an insulating film; 710, a third conductive layer (a conductive member); and 708, an opening (a contact hole) at which the third conductive layer 710 is in contact with the first conductive layer 703; and 709, another opening at which the third conductive layer 710 is in contact with the second conductive layer 705. In conventional processes, the openings 708 and 709 are made by separate masking and separate etching. However, the number of masks and the number of steps can be decreased when the present invention is applied.

In Examples set out above, those shown as the conductive layer through which the opening extends are comprised of one layer. It, however, is apparent that the opening may extend through two or more layers.

The bottom of the opening is by no means limited to a conductive region such as a drain region, and may be an insulating film. In such a case, a conductive material may be deposited in the opening extending through a plurality of conductive layers, and thus the respective conductive layers can be similarly connected.

As described above, according to the present invention, at least three wirings (regions) can be connected by the one-time step of forming a contact hole (the opening), and hence the number of masks and the number of steps can be decreased to make it possible to provide integrated circuits at a low cost and in a high yield.

It is also possible to provide an electrode structure that can be well meet the higher integration in future.

When the present invention is applied to photoelectric transducers or liquid crystal image display devices, it is possible to provide photoelectric transducers that can well obtain light signals or liquid crystal image display devices having a sufficient brightness, because of an increase in the area efficiency of the devices.

What is claimed is:

1. A process for producing a semiconductor device comprising a conductive layer and a transparent electrode which are superposed via an insulating layer, the conductive layer and the transparent electrode being electrically connected, the process comprising the steps of:

(a) simultaneously removing part of the transparent electrode and part of the insulating layer to expose the conductive layer; and (b) depositing a conductive member at the part of the transparent electrode and the part of the insulating layer removed in said step (a), thereby electrically connecting the conductive layer and the transparent electrode.

2. The process for producing a semiconductor device according to claim 1, wherein the transparent electrode comprises indium-tin oxide.

3. The process for producing a semiconductor device according to claim 1, further comprising forming an additional insulating layer on said second conductive layer and removing part of the additional insulating layer simultaneously with the removal in said step (a).

4. The process for producing a semiconductor device according to claim 1, wherein partial removal performed in said step (a) is effected by etching with chloride ions.

5. The process for producing a semiconductor device according to claim 1, wherein partial removal performed in the step (a) is effected by use of a photoresist.

* * * * *

UNITED STATES PATENT AND TRADEMARK OFFICE
CERTIFICATE OF CORRECTION

PATENT NO. : 5,663,094
DATED : September 2, 1997
INVENTOR(S) : Sakamoto

It is certified that error appears in the above-identified patent and that said Letters Patent is hereby corrected as shown below:

COLUMN 1:

Line 29, "end" should read --and--.

COLUMN 2:

Line 19, "can not" should read --cannot--.

COLUMN 4:

Line 54, "these to," should read --thereto,--.

COLUMN 6:

Line 52, "TABLE" should read --TABLE 1--.

COLUMN 7:

Line 29, "end" should read --and--; and
    Line 54, "satisfactory" should read --satisfactorily--.

UNITED STATES PATENT AND TRADEMARK OFFICE
CERTIFICATE OF CORRECTION

PATENT NO. : 5,663,094
DATED : September 2, 1997
INVENTOR(S) : Sakamoto

It is certified that error appears in the above-identified patent and that said Letters Patent is hereby corrected as shown below:

<u>COLUMN 8</u>:

Line 23, "100cm$^{-2}$.At" should read --100cm$^{-2}$. At--.

<u>COLUMN 10</u>:

Line 6, delete "be".

Signed and Sealed this

Twelfth Day of May, 1998

Attest:

Attesting Officer

BRUCE LEHMAN

Commissioner of Patents and Trademarks